United States Patent [19]

Kadoiwa

[11] Patent Number: 5,508,225
[45] Date of Patent: Apr. 16, 1996

[54] METHOD FOR MANUFACTURING SEMICONDUCTOR VISIBLE LASER DIODE

[75] Inventor: Kaoru Kadoiwa, Itami, Japan

[73] Assignee: Mitsubishi Denki Kabushiki Kaisha, Tokyo, Japan

[21] Appl. No.: 218,184

[22] Filed: Mar. 28, 1994

[30] Foreign Application Priority Data

Apr. 8, 1993 [JP] Japan ................... 5-081633

[51] Int. Cl.$^6$ ................................................. H01L 21/20
[52] U.S. Cl. ..................... 437/129; 148/DIG. 95
[58] Field of Search ................. 437/129; 148/DIG. 95

[56] References Cited

U.S. PATENT DOCUMENTS

| | | | |
|---|---|---|---|
| 4,809,287 | 2/1989 | Ohba et al. | 372/45 |
| 5,023,880 | 6/1991 | Suzuki et al. | 372/45 |
| 5,058,120 | 10/1991 | Nitta et al. | 372/46 |
| 5,143,863 | 9/1992 | Ohnaka et al. | 437/129 |
| 5,189,680 | 2/1993 | Kimura | 372/46 |
| 5,268,328 | 12/1993 | Mori et al. | 437/129 |
| 5,304,507 | 4/1994 | Unozawa | 148/DIG. 95 |
| 5,441,912 | 8/1995 | Tsukiji et al. | 148/DIG. 95 |

OTHER PUBLICATIONS

Minagawa et al, "Effect Of Cap Layer and Cooling Atmosphere On The Hole Concentration Of p(Zn)–AlGaInP Grown By Organometallic Vapor Phase Epitaxy", Journal of Crystal Growth, vol. 118, 1992, pp. 425–429.

Hamada et al, "Activation Of Zn Acceptors In AlGaInP Epitaxial Layers Grown On Misoriented Substrates By Metal Organic Chemical Vapour Deposition", Electronics Letters, vol. 28, No. 6, 1992, pp. 585–587.

*Primary Examiner*—R. Bruce Breneman
*Assistant Examiner*—Linda J. Fleck
*Attorney, Agent, or Firm*—Leydig, Voit & Mayer

[57] ABSTRACT

In a method for manufacturing a semiconductor laser diode, producing visible light after growing a p type GaAs contact layer on a p type AlGaInP cladding layer, an n type layer comprising that can be selectively etched with an etchant that does not etch GaAs is grown on the p type GaAs contact layer. After cooling, the n type layer is selectively etched and removed. In this method, a diffusion potential produced at the p-n junction between the p type GaAs contact layer and the n type layer prevents ionized hydrogen from entering the p type AlGaInP cladding layer during cooling, whereby the activation ratio of Zn atoms in the p type AlGaInP cladding layer is increased. Therefore, even if the Zn/III ratio during the growth of the p type AlGaInP cladding layer is low, a semiconductor laser diode with reduced threshold current and improved temperature characteristics is attained. In addition, since the n type layer grown on the p type GaAs contact layer comprises a semiconductor material that can be selectively etched with an etchant that does not etch GaAs, the etching process of the n type layer is carried out with high controllability without adversely affecting the surface of the p type GaAs contact layer, resulting in a highly reliable semiconductor laser diode.

20 Claims, 9 Drawing Sheets

↑ etching

↑ regrowth

METHOD FOR MANUFACTURING SEMICONDUCTOR VISIBLE LASER DIODE

FIELD OF THE INVENTION

The present invention relates to a method for manufacturing a semiconductor laser diode producing visible light (hereinafter referred to as semiconductor visible laser diode) and, more particularly, to a method for manufacturing a semiconductor visible laser diode including a p type AlGaInP cladding layer on an active layer.

BACKGROUND OF THE INVENTION

FIG. 8 is a perspective view illustrating a conventional semiconductor visible laser diode. In the figure, there are successively disposed on an n type GaAs substrate 101 an n type AlGaInP cladding layer 102, an undoped GaInP active layer 103, a p type AlGaInP cladding layer 104, and a p type GaAs cap layer 105. A ridge structure includes the p type GaAs cap layer 105 and a part of the p type AlGaInP cladding layer 104. An n type GaAs current blocking layer 106 is disposed on the p type AlGaInP cladding layer 104 contacting side surfaces of the ridge. A p type GaAs contact layer 107 is disposed on the p type GaAs cap layer 105 and on the n type GaAs current blocking layer 06. An n side electrode 108 is disposed on the rear surface of the substrate 101 and a p side electrode 109 is disposed on the contact layer 107.

A method for manufacturing the laser diode of FIG. 8 is illustrated in FIGS. 9(a)–9(e). In these figures, the same reference numerals as in FIG. 8 designate the same or corresponding parts.

Initially, as illustrated in FIG. 9(a), the n type AlGaInP cladding layer 102, the undoped GaInP active layer 103, the p type AlGaInP cladding layer 104, and the p type GaAs cap layer 105 are successively grown on the n type GaAs substrate 101 by metal organic chemical vapor deposition (MOCVD). The MOCVD growth is carried out at a temperature of 675° C. and a pressure of 150 Torr. Zinc (Zn) is employed as the p type impurity dopant of the p type AlGaInP cladding layer 104 and the p type GaAs cap layer 105. After the crystal growth, the substrate is cooled in an arsine ($AsH_3$) atmosphere to prevent As atoms in the uppermost p type GaAs cap layer 105 from escaping.

In the step of FIG. 9(b), an SiN film 115 is formed on a center part of the p type GaAs cap layer 105. Using the SiN film 115 as a mask, the structure is selectively etched to form a ridge (FIG. 9(c)).

Thereafter, the n type GaAs current blocking layer 106 is grown on the p type AlGaInP cladding layer 104 by MOCVD (FIG. 9(d)). Since no crystalline material is grown on the SiN mask 115, the current blocking layer 106 is selectively grown on opposite sides of the ridge, so that the ridge is embedded in the current blocking layer 106.

After removing the SiN mask 115, the p type GaAs contact layer 107 is grown by MOCVD (FIG. 9(e)). Since the GaAs layers 105 and 106 are exposed over the surface of the structure after the removal of the SiN mask, the growth of the p type GaAs contact layer 107 proceeds forming a flat surface which facilitates contact with a heat sink or an electrode. After the growth of the p type GaAs contact layer 107, the substrate is cooled in an arsine atmosphere to prevent As atoms in the p type GaAs contact layer 107 from escaping, whereby an even surface of the p type GaAs contact layer 107 is attained.

To complete the laser structure of FIG. 8, the n side electrode 108 is formed on the rear surface of the substrate 101 and the p side electrode 109 is formed on the contact layer 107. Usually, the n side electrode comprises Au/Ge/Ni and the p side electrode comprises Ti/Au.

In order to attain the desired laser characteristics of the semiconductor laser diode as shown in FIG. 8, the carrier concentration in the p type AlGaInP cladding layer 104 must not be less than $5.0 \times 10^{17}$ cm$^{-3}$. A low carrier concentration in the cladding layer 104 causes an increase in the laser oscillation threshold and poor output characteristics during the high temperature operation. In the conventional production process illustrated in figures 9(a)–9(e), sufficiently high carrier concentration in the p type AlGaInP cladding layer 104 is achieved by increasing the Zn/III ratio, i.e., the flow rate ratio of the Zn source gas to the source gas of the group III material, to 0.7–1.0 during the growth of the p type AlGaInP cladding layer 104.

In the laser diode manufactured as described above, however, the carrier concentration in the p type AlGaInP cladding layer 104 significantly varies, whereby the laser oscillation threshold current varies and the output characteristics during high temperature operation are very poor. The variation in the carrier concentration occurs because the Zn dopant added to the AlGaInP layer is not completely activated and the activation ratio varies.

In Journal of Crystal Growth 118 (1992), pp. 425 to 429, hydrogen in an AlGaInP layer is reported as a main cause of the reduction in the activation ratio of the Zn dopant atoms in the AlGaInP layer. More specifically, during cooling the substrate in the arsine atmosphere after the growth of the p type GaAs contact layer, arsine ($AsH_3$) is decomposed and generates hydrogen ions. This hydrogen enters the AlGaInP layer from the surface of the wafer and prevents the Zn dopant atoms in the AlGaInP layer from activating.

In Electronics Letters, 12th March 1992, Vol.28, No.6, pp.585 to 587, in order to remove the hydrogen, the wafer is heated to a temperature of 450°–740° C. in a mixture of hydrogen and nitrogen after the growth of the p type AlGaInP cladding layer.

When this post-heat treatment is applied to the method of producing a semiconductor visible laser diode illustrated in FIGS. 9(a)–9(e), in order to effectively remove the hydrogen and increase the activation ratio of the Zn dopant atoms in the p type AlGaInP cladding layer 104, the post-heat treatment is carried out after the growth of the p type GaAs contact layer 107 shown in FIG. 9(e). However, if the wafer is heated to 450°–740° C. in the mixture of hydrogen and nitrogen after the growth of the p type GaAs contact layer 107, As atoms unfavorably escape from the surface of the GaAs contact layer 107, resulting in a rough surface of the GaAs contact layer 107. The rough surface causes an imperfect connection between the contact layer 107 and the electrode 109, significantly reducing the reliability of the laser diode.

Meanwhile, in the above-described Journal of Crystal Growth article, an n type GaAs layer is grown on the p type AlGaInP layer to remove hydrogen from the AlGaInP layer and increase the carrier concentration in the AlGaInP layer. When this process is applied to the production method illustrated in FIGS. 9(a)–9(e), in order to effectively remove the hydrogen and increase the activation ratio of the Zn dopant atoms in the p type AlGaInP cladding layer 104, the n type GaAs layer is grown on the p type GaAs contact layer 107 shown in FIG. 9(e). After the wafer cooling process, the n type GaAs layer is removed. However, since it is difficult to selectively etch away the n type GaAs layer leaving the underlying p type GaAs layer 107 unetched, the p type GaAs layer 107 after the etching process has an uneven surface. The uneven surface causes an imperfect connection between the p type GaAs contact layer 107 and the electrode, significantly reducing the reliability of the laser diode.

SUMMARY OF THE INVENTION

An object of the present invention is to provide a method for manufacturing a semiconductor visible laser diode with a stable laser oscillation threshold current and improved output characteristics during high temperature operation, in which the carrier concentration in the p type AlGaInP cladding layer is increased without roughening the surface of the epitaxially grown layer before the formation of the p side electrode.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a first aspect of the present invention, in a method for manufacturing a semiconductor visible laser diode, after growing a p type GaAs contact layer on a p type AlGaInP cladding layer, an n type layer comprising a semiconductor material which can be selectively etched with an etchant that does not etch GaAs is grown on the p type GaAs contact layer. After cooling the wafer, the n type layer is selectively etched away. In this method, a diffusion potential produced at the p-n junction between the p type GaAs contact layer and the n type layer prevents hydrogen from entering into the p type AlGaInP cladding layer during cooling of the wafer, whereby the activation ratio of Zn atoms in the p type AlGaInP cladding layer is increased. Therefore, even if the Zn/III ratio during the growth of the p type AlGaInP cladding layer is low, a semiconductor visible laser diode with a reduced threshold current and improved high temperature characteristics is attained. In addition, since the n type layer grown on the p type GaAs contact layer comprises a semiconductor material which can be selectively etched with an etchant that does not etch GaAs, the etching process of the n type layer is carried out with high controllability without adversely affecting the surface of the p type GaAs contact layer, resulting in a highly reliable semiconductor visible laser diode.

According to a second aspect of the present invention, in the above-described method, the wafer is cooled in a hydrogen atmosphere, nitrogen atmosphere, or mixture of hydrogen and nitrogen. Therefore, generation of hydrogen ions during the wafer cooling process is suppressed, increasing the activation ratio of Zn atoms in the p type AlGaInP cladding layer.

According to a third aspect of the present invention, in a method for manufacturing a semiconductor visible laser diode, after successively growing an active layer, a p type AlGaInP cladding layer, and a p type GaAs cap layer on a substrate, a first n type layer comprising a semiconductor material which can be selectively etched with an etchant that does not etch GaAs is grown on the p type GaAs cap layer. After cooling the wafer, the first n type layer is selectively etched away. Then, a p type GaAs contact layer is regrown on the p type GaAs cap layer and, subsequently, a second n type layer comprising a semiconductor material which can be selectively etched with an etchant that does not etch GaAs is grown on the p type GaAs contact layer. After cooling the wafer, the second n type layer is selectively etched away. Therefore, Zn atoms in the p type AlGaInP cladding layer are a hundred percent activated before the regrowth process, so that no Zn atoms diffuse into the active layer during the subsequent crystal growth process, preventing an increase in the oscillation threshold current and a reduction in the reliability of the laser diode.

DETAILED DESCRIPTION OF THE PREFERRED EMBODIMENTS

Figure 1:
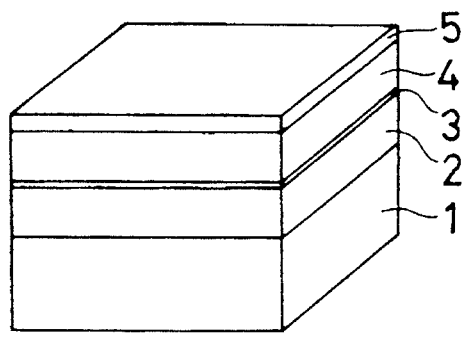
FIG. 1(a)–1(f) are perspective views illustrating process steps in a method for manufacturing a semiconductor visible laser diode in accordance with a first embodiment of the present invention.

FIG. 1(a)–1(f) are perspective views illustrating process steps in a method for manufacturing a semiconductor visible laser diode in accordance with a first embodiment of the present invention. In the figures, reference numeral 1 designates a GaAs substrate. An n type AlGaInP cladding layer 2 is disposed on the GaAs substrate 1. An undoped GaInP active layer 3 is disposed on the cladding layer 2. A p type AlGaInP cladding layer 4 is disposed on the active layer 3. A p type GaAs cap layer 5 is disposed on the cladding layer 4. A ridge structure includes the cap layer 5 and a part of the cladding layer 4. An n type GaAs current blocking layer 6 is disposed on the cladding layer 4 contacting opposite sides of the ridge. A p type GaAs contact layer 7 is disposed on the cap layer 5 and the current blocking layer 6. An n type AlGaInP layer 10 is disposed on the contact layer 7. An undoped GaAs layer 11 is disposed on the n type AlGaInP layer 10. Reference numeral 15 designates an SiN film pattern.

Initially, there are successively epitaxially grown on the n type GaAs substrate 1 the n type AlGaInP cladding layer 2 about 1.5 μm thick, the undoped GaAs active layer 3 about 150 Å thick, the p type AlGaInP cladding layer 4 about 1.5 μm thick, and the p type GaAs cap layer 5 about 0.5 μm thick (FIG. 1(a)). These layers are grown by MOCVD at a temperature of 675° C. and a pressure of 150 Torr. Silicon (Si) is employed as an n type impurity dopant of the n type AlGaInP cladding layer 2 and zinc (Zn) is employed as a p type impurity dopant of the p type AlGaInP cladding layer 4 and the p type GaAs cap layer 5. The wafer is cooled in an arsine atmosphere after the crystal growth of the p type GaAs cap layer 5 to prevent As atoms in the GaAs cap layer 5 from escaping.

Figure 1B:
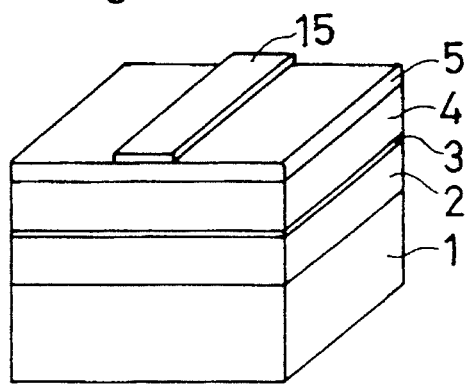
Figure 1:
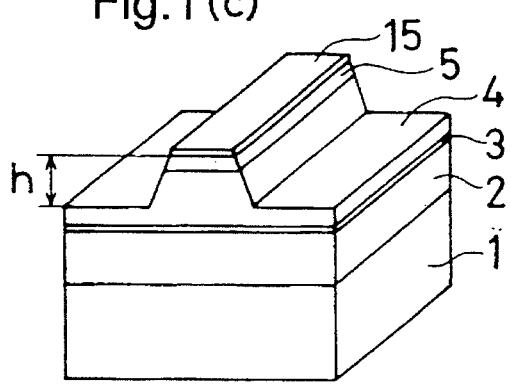
Figure 1:
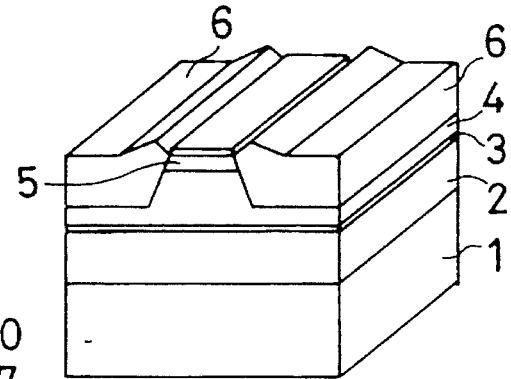
Figure 1:
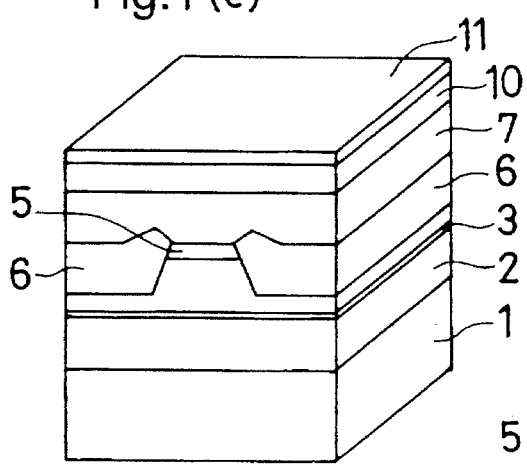
Figure 1:
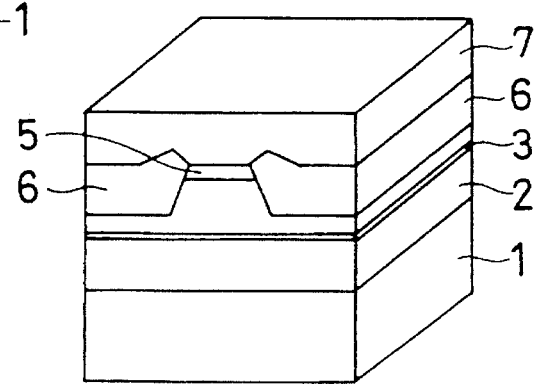

Then, an SiN film 15 is formed on a center part of the p type GaAs cap layer 5 (FIG. 1(b)). Using the SiN film 15 as a mask, the structure is selectively etched to form a ridge (FIG. 1(c)). The height of the ridge is about 1.2 μm.

Thereafter, the n type GaAs current blocking layer 6 is regrown by MOCVD (FIG. 1(d)). During the growth, since no crystal growth occurs on the SiN mask 15, the current blocking layer 6 is selectively grown on opposite side surfaces of the ridge, so that the ridge is embedded in the current blocking layer 6.

After removing the SiN mask 15, the p type GaAs contact layer 7, the n type AlGaInP layer 10, and the undoped GaAs layer 11 are successively grown by MOCVD (FIG. 1(e)). After the growth of the undoped GaAs layer 11, the wafer is cooled in a hydrogen atmosphere to prevent the generation of hydrogen ions. Although the surface of the undoped GaAs layer 11 becomes rough due to the escape of As atoms from the surface, since the undoped GaAs layer 11 will be removed before the formation of electrodes, the rough surface offers no problem. The typical thickness of the p type GaAs contact layer 7 is about 3 μm. In addition, Zn is employed as a p type impurity dopant of the p type GaAs contact layer 7 and the carrier concentration in the contact layer 7 is as high as $1\times10^{19}$ cm$^{-3}$. In addition, Si is employed as an n type impurity dopant of the n type AlGaInP layer 10.

In the step of FIG. 1(f), the undoped GaAs layer 11 and the n type AlGaInP layer 10 are etched away. The undoped GaAs layer 11 is etched with an etchant of tartaric acid or sulfuric acid. The n type AlGaInP layer 10 is etched with an etchant of hydrochloric acid. Since the hydrochloric acid does not etch GaAs but etches AlGaInP with high selectivity, the n type AlGaInP layer 10 is removed with high controllability and without roughening the surface of the p type GaAs contact layer 7.

After removing the undoped GaAs layer 11 and the n type AlGaInP layer 10, an n side electrode is formed on the rear surface of the substrate 1 and a p side electrode is formed on the contact layer 7 to complete a semiconductor visible laser diode.

Figure 2:
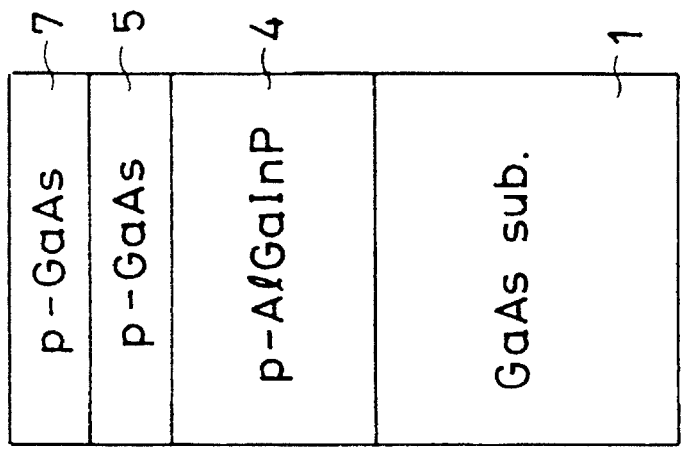
FIGS. 2(a)–2(c) are schematic diagrams illustrating process steps in an experiment for examining effects of an n type AlGaInP layer.
Figure 2:
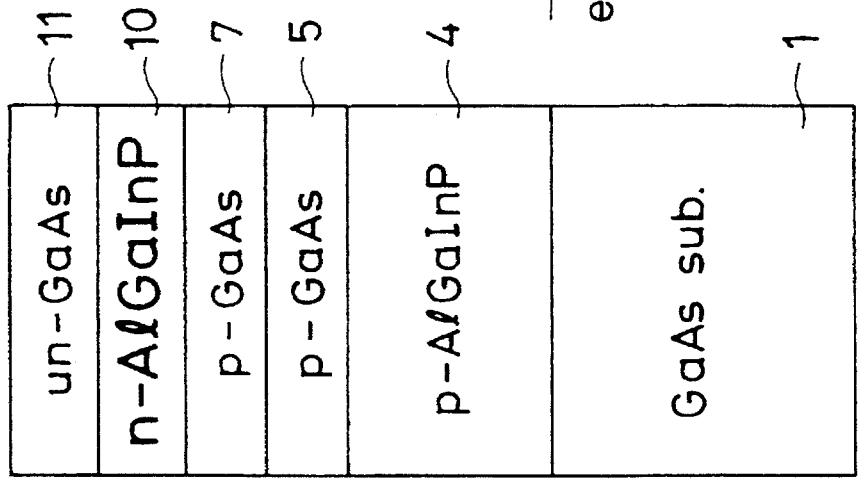
Figure 2:
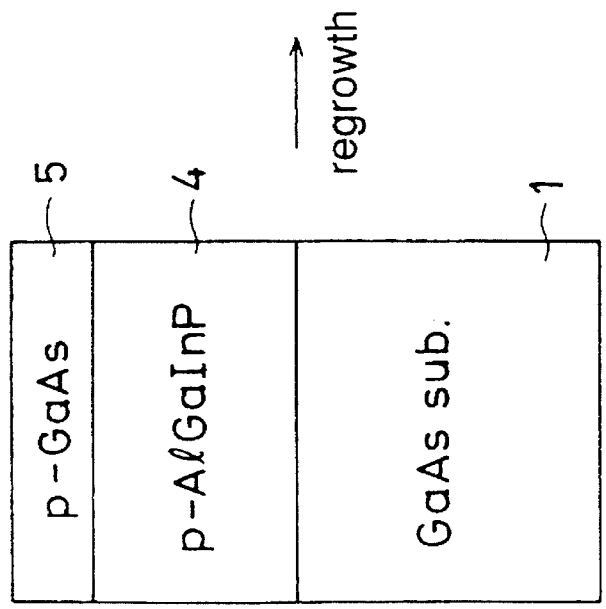

FIGS. 2(a)–2(c) illustrates process steps in an experiment for examining the effect of the n type AlGaInP cap layer 10 grown on the p type GaAs contact layer 7.

In this experiment, first of all, the p type AlGaInP layer 4 and the p type GaAs layer 5 are grown on the GaAs substrate 1 and the carrier concentration in the p type AlGaInP layer 4 is measured (FIG. 2(a)). Then, the p type GaAs layer 7, the n type AlGaInP cap layer 10, and the undoped GaAs cap layer 11 are successively grown (FIG. 2(b)). Finally, the undoped GaAs cap layer 11 and the n type AlGaInP cap layer 10 are etched away and the carrier concentration in the p type AlGaInP layer 4 is measured again (FIG. 2(c)).

Figure 3:
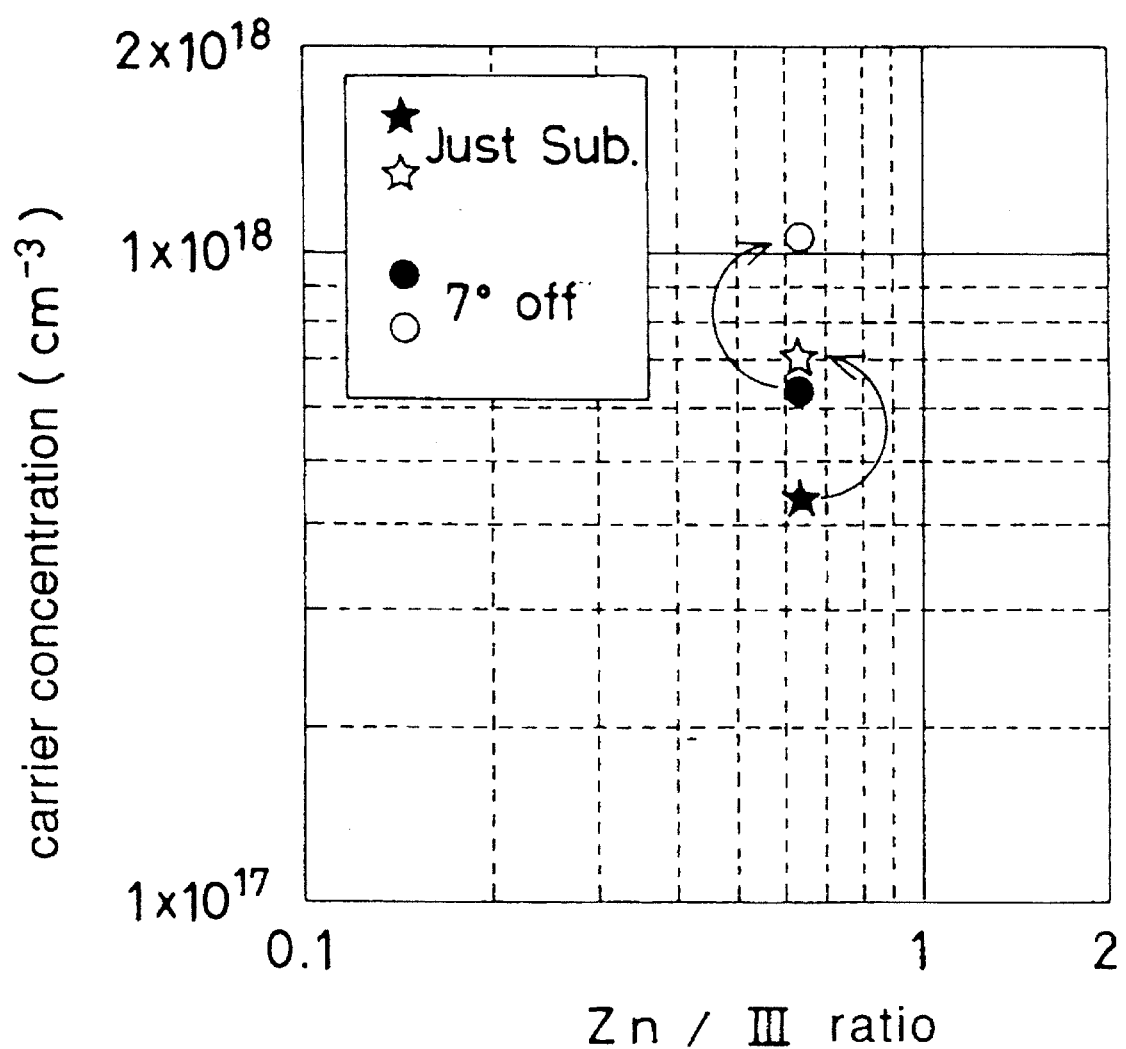
FIG. 3 is a graph showing a result of the experiment.

The result of the experiment is shown in FIG. 3. In FIG. 3, the abscissa shows the Zn/III ratio, i.e., the flow rate ratio of the Zn source gas to the source gas of group III material, and the ordinate shows the carrier concentration in the p type AlGaInP layer. In addition, ★ and ☆ show the carrier concentrations of the p type AlGaInP layer in the steps of FIGS. 2(a) and 2(c), respectively, where the GaAs substrate 1 has a (100) surface orientation. The carrier concentration of $4\times10^{17}$ cm$^{-3}$ in the p type AlGaInP layer in the step of FIG. 2(a) is increased to $7\times10^{17}$ cm$^{-3}$ through the regrowth and etching processes. The reason is as follows. A p-n junction is produced when the n type AlGaInP cap layer 10 is grown on the p type GaAs layer 5, and a diffusion potential produced at the p-n junction prevents hydrogen ions from entering the p type AlGaInP layer 4 during cooling of the wafer, whereby the activation ratio of Zn dopant atoms in the p type AlGaInP layer 4 is increased.

In FIG. 3, ● and ○ show the carrier concentrations of the p type AlGaInP layer in the steps of FIGS. 2(a) and 2(c), respectively, in case where the surface orientation of the GaAs substrate 1 is inclined at seven degrees in the [011] direction from the (100) direction. Thus, it is found that the same effect of the n type AlGaInP cap layer 10 as described above is attained even if the orientation of the surface GaAs substrate 1 is off-set.

In the production process of the first embodiment shown in FIGS. 1(a)–1(f), the carrier concentration in the p type GaAs contact layer 7 is $1\times10^{19}$ cm$^{-3}$ or more. In this case, if the carrier concentration in the n type AlGaInP cap layer 10 is about $3\times10^{17}$ cm$^{-3}$ a diffusion potential that can effectively prevent hydrogen ions from entering into the p type AlGaInP layer 4 during cooling of the wafer is formed at the p-n junction between the p type GaAs contact layer 7 and the n type AlGaInP cap layer 10. At this time, a depletion layer about 0.1 μm thick is formed at the p-n junction, so that the n type AlGaInP cap layer 10 should be thicker than the depletion layer. For example, the cap layer 10 is about 0.3 μm thick.

Figure 4:
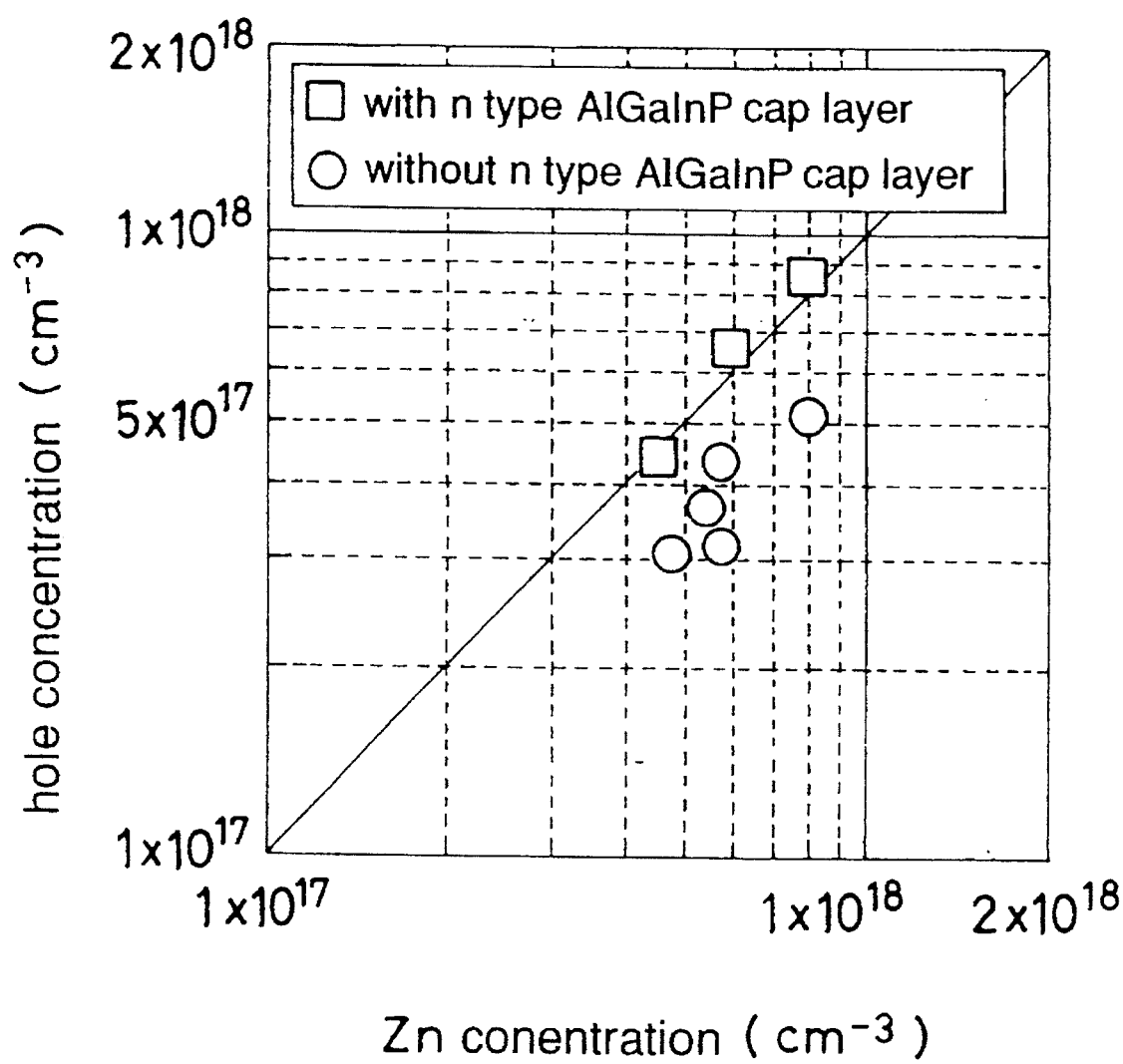
FIG. 4 is a graph for explaining an increase in the activation ratio of Zn dopant atoms in the p type AlGaInP layer.

FIG. 4 is a graph illustrating the relationship between the hole concentration and the Zn concentration in the p type AlGaInP layer 4 with and without the n type AlGaInP cap layer 10. In the graph, the abscissa shows the Zn concentration, i.e., the number of Zn atoms, in the p type AlGaInP layer 4 measured using SIMS (Secondary Ion Mass Spectrometry) and the ordinate shows the hole concentration, i.e., the number of activated Zn atoms, in the p type AlGaInP layer 4. The activation ratio of Zn atoms in the p type AlGaInP layer 4 is attained by dividing the hole concentration by the Zn concentration. In addition, 0 shows the Zn activation ratio when the n type AlGaInP cap layer 10 is absent from the p type GaAs contact layer 7 and □ shows the Zn activation ratio when the n type AlGaInP cap layer 10 is present on the p type GaAs contact layer 7. While the Zn activation ratio in the p type AlGaInP layer 4 without the n type AlGaInP cap layer 10 is 60~70%, the Zn activation ratio with the n type AlGaInP cap layer 10 is 100%. That is, the Zn activation ratio in the p type AlGaInP layer 4 is significantly increased by the n type AlGaInP cap layer 10 grown on the p type GaAs contact layer 7.

Figure 5:
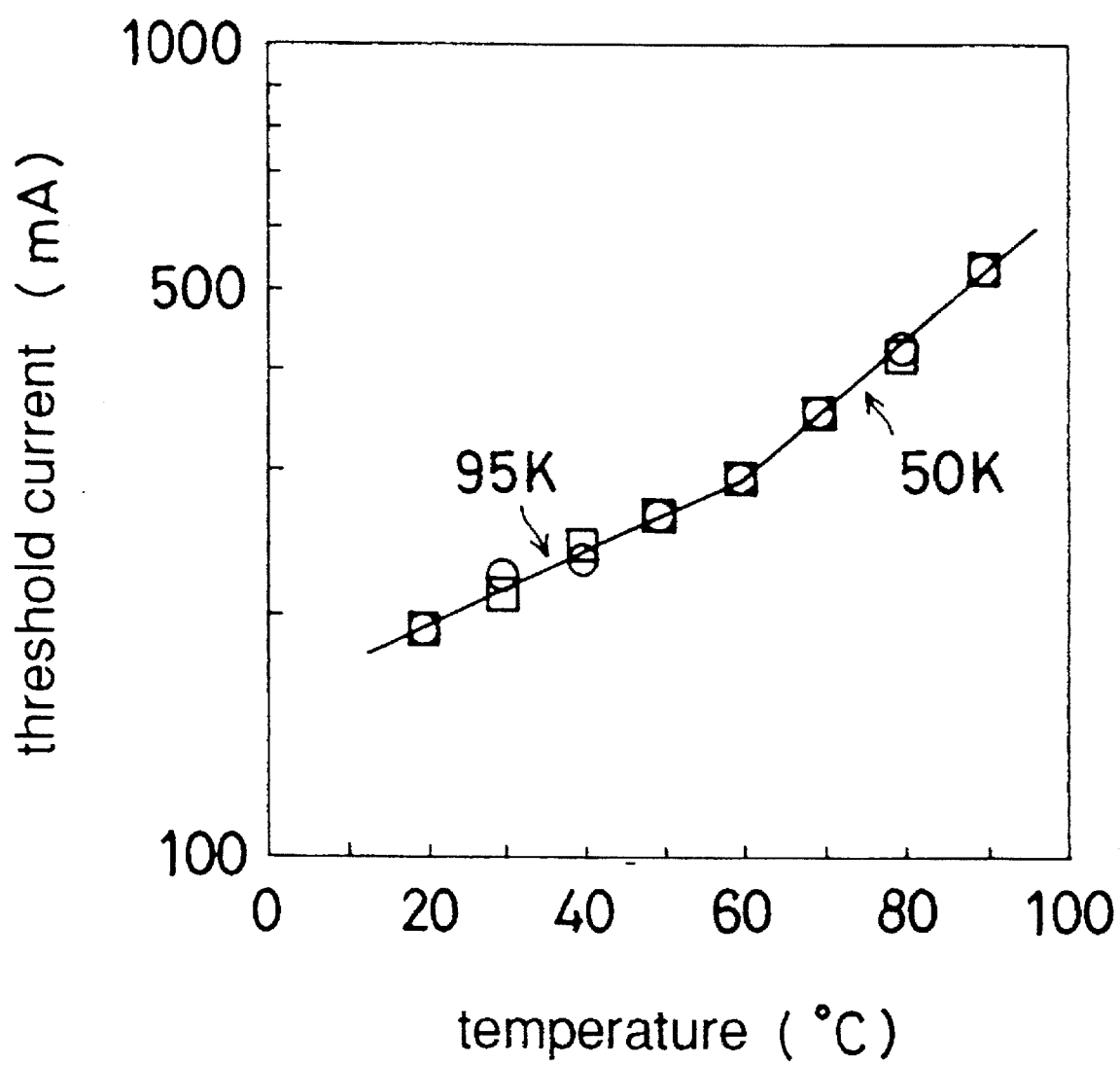
FIG. 5 is a graph showing temperature dependence of threshold current of a semiconductor visible laser diode produced by the conventional method employing a Zn/III ratio during growth of a p type AlGaInP cladding layer of 1, compared to that of a semiconductor visible laser diode produced by the method shown in FIGS. 1(a)–1(f) employing a Zn/III ratio of 0.7.

In the production process according to the first embodiment of the present invention, since the Zn activation ratio is increased as described above, 60~70% of the Zn dopant used conventionally produces the same carrier concentration as that attained in the conventional process. FIG. 5 is a graph showing temperature dependence of threshold current of the semiconductor visible laser diode produced by the conventional method illustrated in FIGS. 9(a)–9(e) in which the Zn/III ratio during the growth of the p type AlGaInP cladding layer 104 is 1, i.e., the dose of Zn dopant is 100%, compared to that of the semiconductor visible laser diode produced by the method illustrated in FIGS. 1(a)–1(f) in which the Zn/III ratio is 0.7, i.e., the dose of the Zn dopant is 70%. In the graph, the abscissa shows the laser temperature and the ordinate shows the oscillation threshold current. In addition, □ shows characteristics of the semiconductor visible laser diode produced by the conventional method and ○ shows characteristics of the semiconductor visible laser diode produced by the method according to the first embodiment of the present invention. As shown in the graph, the temperature dependence of the threshold current concentration profile of the laser diode produced by the conventional method with the Zn/III ratio of 1 is the same as that of the laser diode according to the present invention with the Zn/III ratio of 0.7. This means that the two laser diodes have the same carrier concentration in the p type AlGaInP cladding layer. That is, according to the production method of the first embodiment of the present invention, the same carrier concentration is achieved with lower dose of Zn dopant than in the conventional method.

While in the above-described first embodiment the undoped GaAs layer 11 is grown on the n type AlGaInP cap layer 10 because it is preferable for the MOCVD apparatus that the crystal growth be finished with the growth of the semiconductor layer including no phosphorus (P), the undoped GaAs layer 11 may be dispensed with. Even in this case, the same effect as described above is achieved.

While in the above-described first embodiment the wafer is cooled in a hydrogen atmosphere after the growth of the undoped GaAs layer 11, the cooling atmosphere may be nitrogen, a mixture of hydrogen and nitrogen, or arsine. When the wafer is cooled in an arsine atmosphere, ionized hydrogen is generated at the surface of the wafer. However, since the diffusion potential produced at the p-n junction between the n type AlGaInP cap layer 10 and the p type GaAs layer 7 prevents the hydrogen from entering into the p type AlGaInP cladding layer 4, the Zn activation ratio in the p type AlGaInP cladding layer 4 is not reduced.

FIGS. 6(a)–6(f) are perspective views illustrating process steps in a method for manufacturing a semiconductor visible laser diode in accordance with a second embodiment of the present invention. In the figures, the same reference numerals as those in FIGS. 1(a)–1(f) designate the same or corresponding parts. Reference numeral 20 designates an n type AlGaInP layer and numeral 21 designates an undoped GaAs layer.

Figure 6:
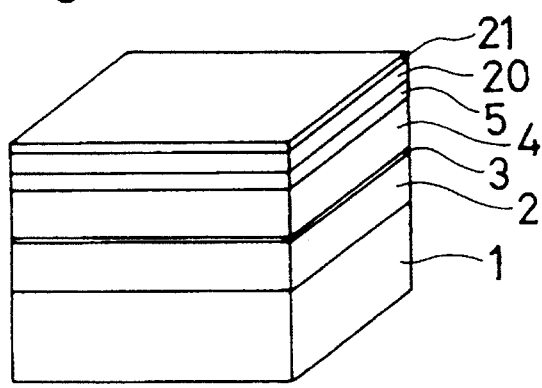
FIGS. 6(a)–6(f) are perspective views illustrating process steps in a method for manufacturing a semiconductor visible laser diode in accordance with a second embodiment of the present invention.
Figure 6:
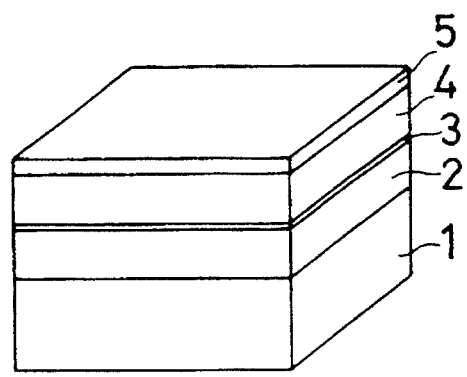
Figure 6:
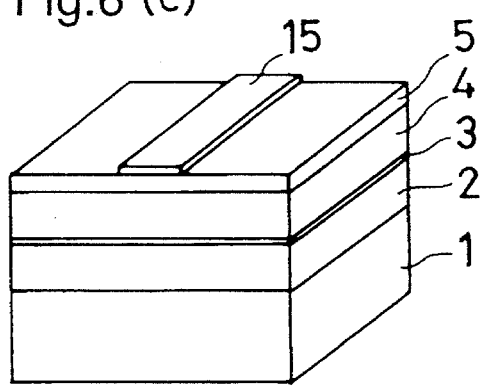
Figure 6:
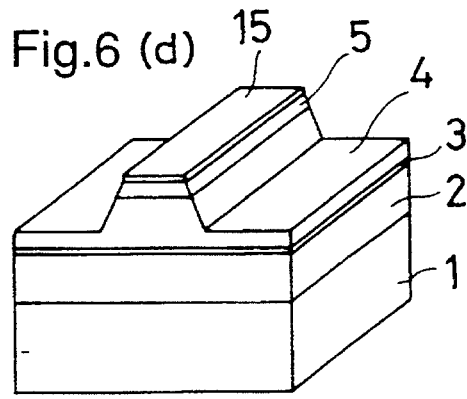
Figure 6:
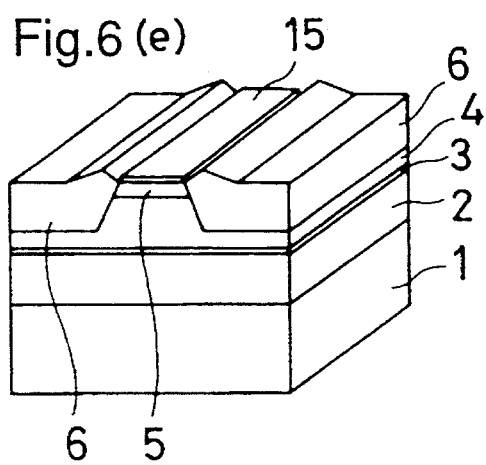
Figure 6:
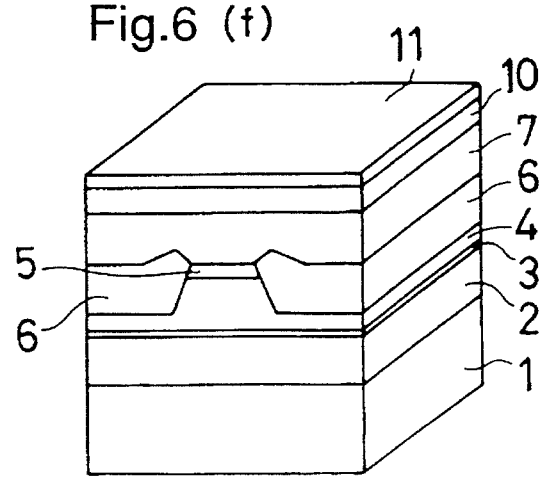

Initially, as illustrated in FIG. 6(a), there are successively grown on the n type GaAs substrate 1 the n type AlGaInP cladding layer 2, the undoped GaAs active layer 3, the p type AlGaInP cladding layer 4, the p type GaAs cap layer 5, the n type AlGaInP layer 20, and the undoped GaAs layer 21. These layers are grown by MOCVD.

In the step of FIG. 6(b), the undoped GaAs layer 21 and the n type AlGaInP layer 20 are etched away. The undoped GaAs layer 21 is etched with an etchant of tartaric acid or sulfuric acid, and the n type AlGaInP layer 20 is etched with an etchant of hydrochloric acid. The etching process is carried out with high controllability without roughening the surface of the p type GaAs cap layer 5, so that the quality of a crystal layer grown on the cap layer 5 is not degraded.

Process steps illustrated in FIGS. 6(c)–6(f) are identical to the process steps already described with respect to FIGS. 1(b)–1(e). That is, an SiN film 15 is formed on the p type GaAs cap layer 5 (FIG. 6(c)) and the structure is etched using the SiN film 15 as a mask to form a ridge (FIG. 6(d)). Thereafter, the n type GaAs current blocking layer 6 is regrown by MOCVD (FIG. 6(e)). After removing the SiN mask 15, the p type GaAs contact layer 7, the n type AlGaInP layer 10, and the undoped GaAs layer 11 are successively grown (FIG. 6(f)). After the growth of the undoped GaAs layer 11, the wafer is cooled in a hydrogen atmosphere. Thereafter, the undoped GaAs layer 11 and the n type AlGaInP layer 10 are removed by etching. To complete a semiconductor visible laser diode, an n side electrode and a p side electrode are formed on the rear surface of the substrate 1 and the contact layer 7, respectively.

In the above-described first embodiment of the present invention, since the wafer is cooled in an arsine atmosphere after the first crystal growth, i.e., after the growth of the p type GaAs cap layer 5, to prevent As atoms in the GaAs cap layer 5 from escaping, ionized hydrogen enters into the p type AlGaInP cladding layer 4 during the cooling process, so that the Zn dopant atoms in the p type AlGaInP cladding layer 4 are not one hundred percent activated after the first crystal growth. That is, at the end of the first crystal growth, a lot of non-activated Zn atoms are present in the p type AlGaInP cladding layer 4, and these Zn atoms unfavorably diffuse into the active layer during the subsequent crystal growth process, increasing the oscillation threshold current and reducing the reliability of the laser diode.

In the second embodiment of the present invention, however, since the n type AlGaInP layer 20 is grown on the p type GaAs layer 5 in the first crystal growth process, no ionized hydrogen enters the p type AlGaInP cladding layer 4 during the wafer cooling process. Therefore, Zn atoms in the p type AlGaInP cladding layer 4 are one hundred percent activated at the end of the first crystal growth process, so that no Zn atoms diffuse into the active layer during the subsequent crystal growth process, avoiding the above-described problems, i.e., an increase in the oscillation threshold current and a reduction in reliability.

Figure 7:
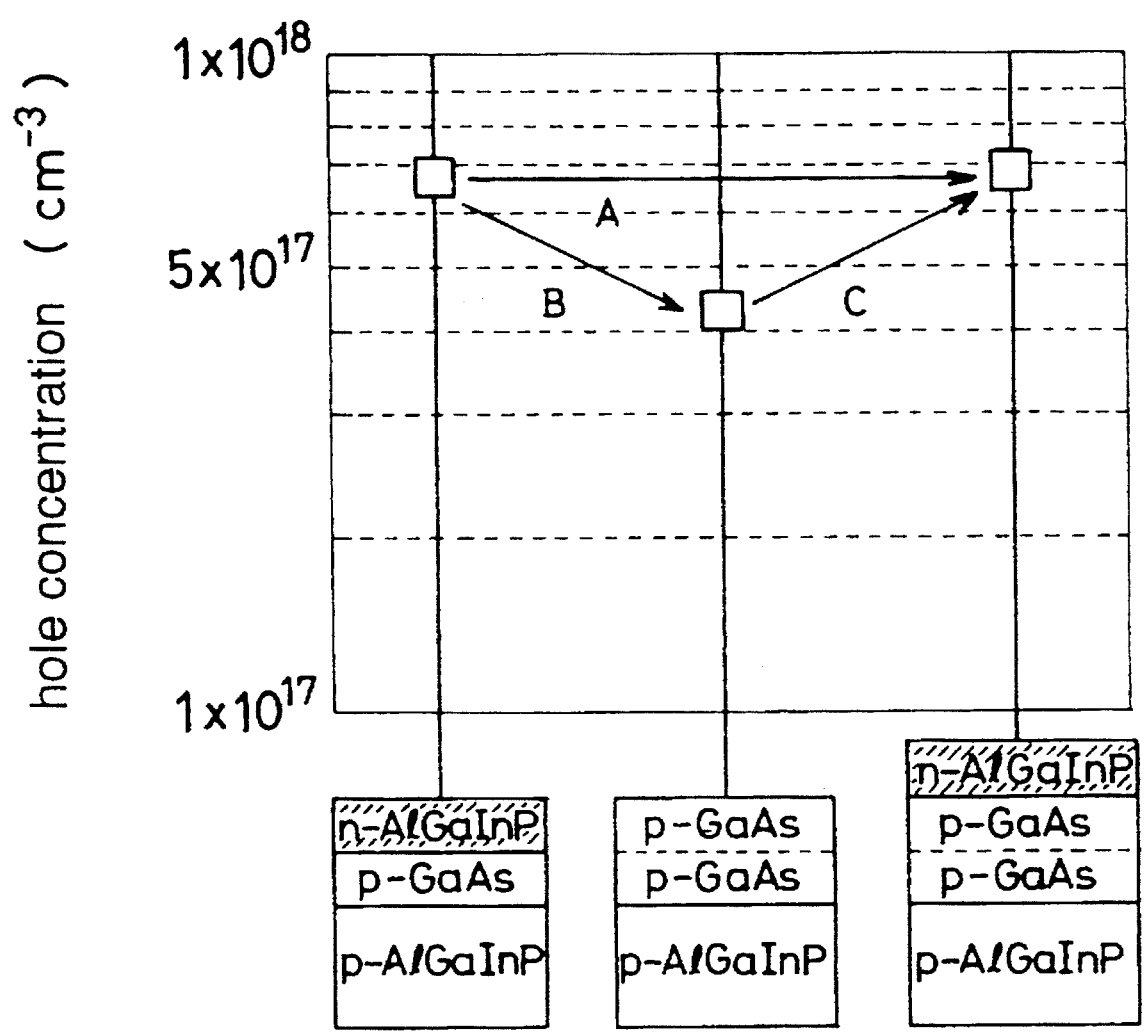
FIG. 7 is a diagram illustrating dependence of hole concentration in a p type AlGaInP layer on re-growth structures in case where an n type AlGaInP layer is grown on the p type GaAs layer in the first crystal growth step.
Figure 8:
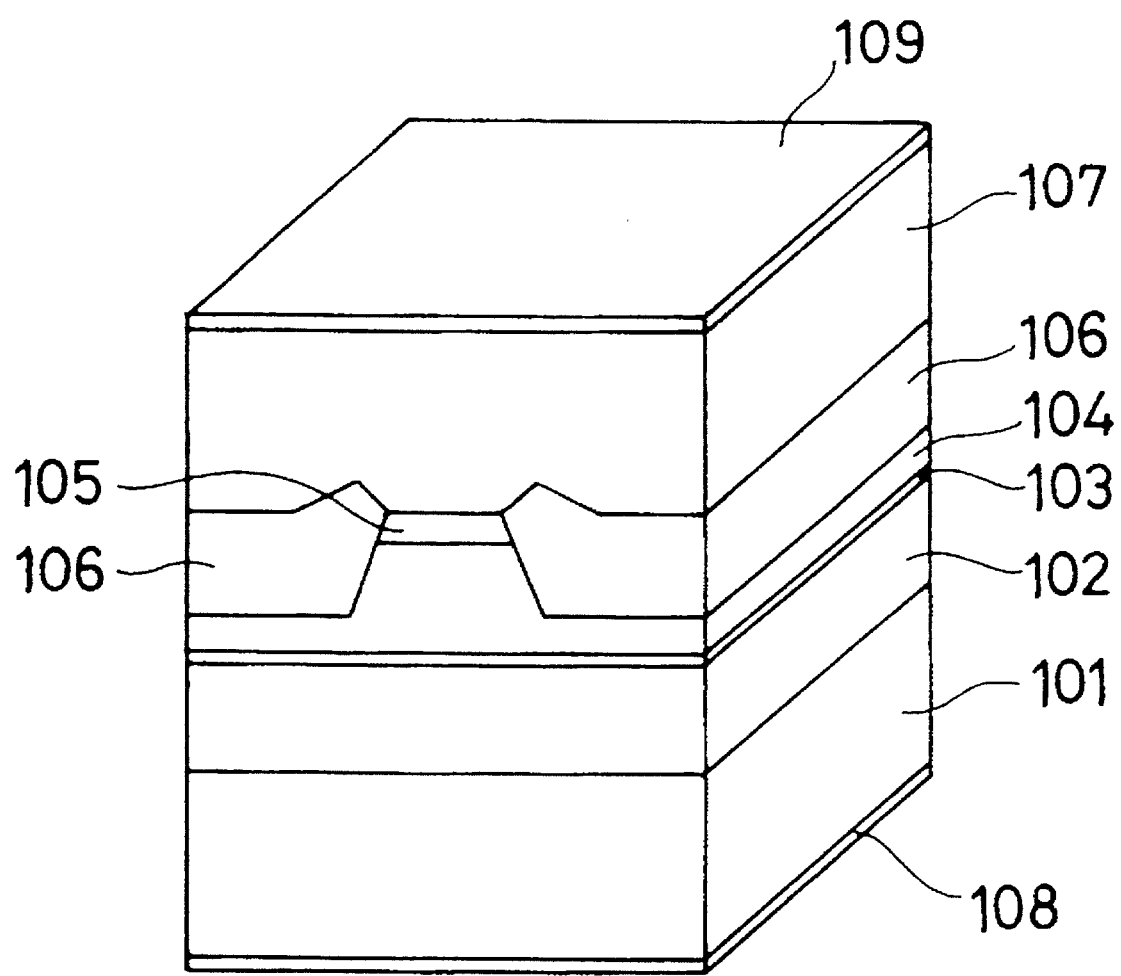
FIG. 8 is a perspective view illustrating a ridge waveguide type semiconductor visible laser diode.
Figure 9:
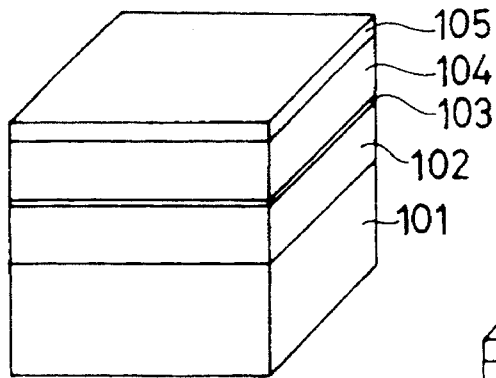
FIGS. 9(a)–9(e) are perspective views illustrating process steps in a method for manufacturing the laser diode of FIG. 8.
Figure 9:
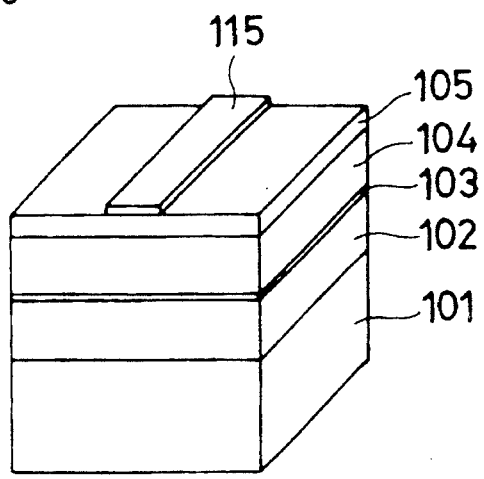
Figure 9:
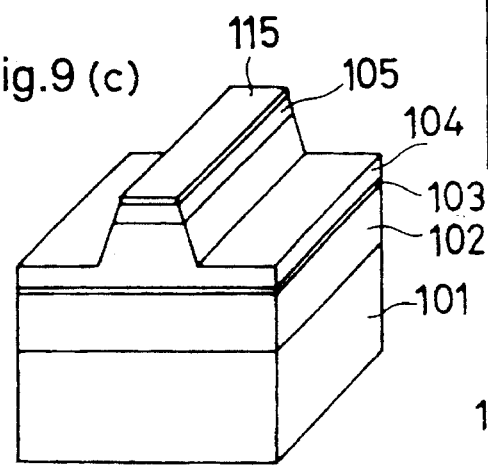
Figure 9:
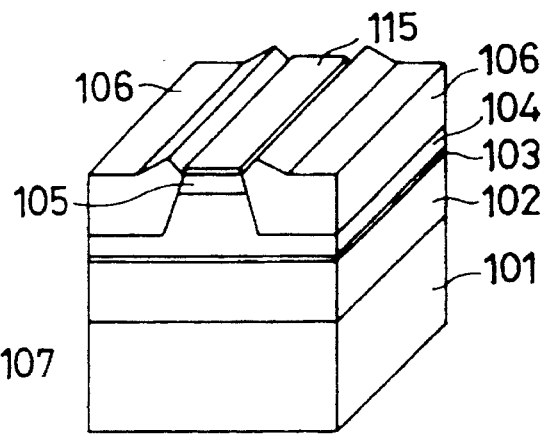
Figure 9:
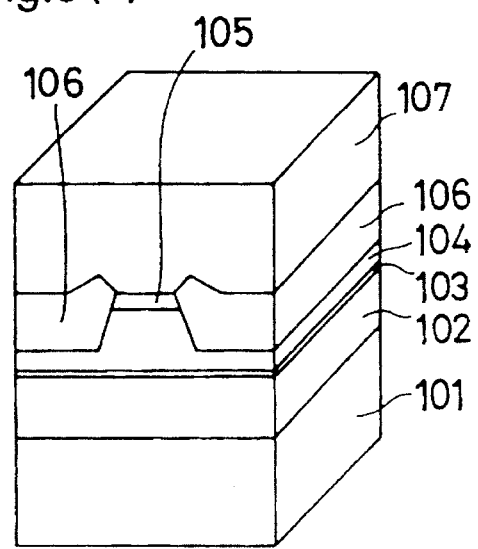

FIG. 7 shows the dependence of the carrier concentration in the p type AlGaInP layer 4 on regrowth structures when the n type AlGaInP layer 20 is grown on the p type GaAs layer 5 in the first crystal growth step. In the second embodiment of the present invention, although the Zn dopant atoms in the p type AlGaInP cladding layer 4 are one hundred percent activated at the end of the first crystal growth, the n type AlGaInP layer 10 is grown on the p type GaAs contact layer 7. The reason is as follows. If the n type AlGaInP layer 10 is not grown subsequently to the regrowth of the p type GaAs contact layer 7, the activation ratio of Zn dopant atoms is reduced from 100% and the carrier concentration in the p type AlGaInP layer 4 is reduced as indicated by the arrow B of FIG. 7. In this second embodiment, since the n type AlGaInP layer 10 is grown on the p type GaAs contact layer 7, the carrier concentration in the p type AlGaInP layer 4 is not reduced as indicated by the arrow A.

While in the above-described first and second embodiments the n type AlGaInP layer 10 is grown subsequently to the regrowth of the p type GaAs contact layer 7, the wafer cooling process in an arsine atmosphere may be inserted between the regrowth of the p type GaAs contact layer 7 and the growth of the n type AlGaInP layer 10. In this case, the wafer, after the cooling process, is again heated and the n type AlGaInP layer 10 is grown on the contact layer 7, whereby the carrier concentration in the p type AlGaInP cladding layer 4 is increased as indicated by the arrow C of FIG. 7.

While in the above-described second embodiment the undoped GaAs layer 21 is grown on the n type AlGaInP layer 20 because it is preferable for the MOCVD apparatus that the crystal growth should be finished with the growth of the semiconductor layer including no phosphorus (P), the undoped GaAs layer 21 may be dispensed with. Also in this case, the same effects as described above are attained.

What is claimed is:

1. A method for manufacturing a semiconductor laser diode producing visible light and including a p type AlGaInP cladding layer on an active layer, said method including:

successively growing an active layer, a p type AlGaInP cladding layer, and a p type GaAs cap layer on a semiconductor substrate;

regrowing a p type GaAs contact layer on said p type GaAs cap layer;

growing a first n type layer on said p type GaAs contact layer, said first n type layer comprising a semiconductor material that can be selectively etched with an etchant that does not etch GaAs and, thereafter, cooling the wafer; and selectively etching and removing said first n type layer.

2. The method of claim 1 including adding Zn as a p type impurity dopant while growing said p type AlGaInP layer.

3. The method of claim 1 including cooling said semiconductor substrate in one of a hydrogen atmosphere, a nitrogen atmosphere, and a mixture of hydrogen and nitrogen.

4. The method of claim 1 including growing an n type AlGaInP layer as said first n type layer.

5. The method of claim 4 including selectively etching said first n type AlGaInP layer with hydrochloric acid.

6. The method of claim 4 including:

successively growing said first n type AlGaInP layer and a first GaAs layer; and selectively etching and removing said first GaAs layer and said first n type AlGaInP layer.

7. The method of claim 6 including selectively etching said first GaAs layer with one of tartaric acid and sulfuric acid.

8. A method for manufacturing a semiconductor laser diode producing visible light and including a p type AlGaInP cladding layer on an active layer, said method comprising:

successively growing an n type AlGaInP cladding layer, a GaInP active layer, a p type AlGaInP cladding layer, and a p type GaAs cap layer on an n type GaAs substrate;

forming a stripe-shaped insulating film pattern on a part of said p type GaAs cap layer;

removing portions of said p type GaAs cap layer and said p type AlGaInP cladding layer by etching using said insulating film pattern as a mask to form a stripe-shaped ridge;

using said insulating film pattern as a mask, selectively growing an n type GaAs current blocking layer on said p type AlGaInP cladding layer contacting opposite side walls of said ridge;

removing said insulating film pattern;

growing a p type GaAs contact layer on said p type GaAs cap layer and on said n type GaAs current blocking layer and, successively, growing an n type AlGaInP layer and a GaAs layer on said p type GaAs contact layer and, thereafter, cooling the wafer;

selectively etching and removing said GaAs layer and said n type AlGaInP layer; and forming a p side electrode on said p type GaAs contact layer and an n side electrode on the rear surface of said n type GaAs substrate.

9. The method of claim 8 including adding Zn as a p type impurity dopant while growing said p type AlGaInP layer.

10. The method of claim 8 including cooling said semiconductor substrate in one of a hydrogen atmosphere, a nitrogen atmosphere, and a mixture of hydrogen and nitrogen.

11. The method of claim 8 including selectively etching said n type AlGaInP layer with hydrochloric acid and selectively etching said GaAs layer with one of tartaric acid and sulfuric acid.

12. The method of claim 1 including:

after the growth of said p type GaAs cap layer, growing a second n type layer on said p type GaAs cap layer, said second n type layer comprising a semiconductor material which can be selectively etched with an etchant that does not etch GaAs and, thereafter, cooling the wafer; and etching and removing said second n type layer.

13. The method of claim 12 including growing an n type AlGaInP layer as said second n type layer.

14. The method of claim 13 including selectively etching said second n type AlGaInP layer with hydrochloric acid.

15. The method of claim 13 including:

successively growing said second n type AlGaInP layer and a second GaAs layer; and selectively etching and removing said second GaAs layer and said second n type AlGaInP layer.

16. The method of claim 15 including selectively etching said second GaAs layer with one of tartaric acid and sulfuric acid.

17. A method for manufacturing a semiconductor laser diode producing visible light and including a p type AlGaInP cladding layer on an active layer, said method comprising:

successively growing an n type AlGaInP cladding layer, a GaInP active layer, a p type AlGaInP cladding layer, a p type GaAs cap layer, a first n type AlGaInP layer, and a first GaAs layer on an n type GaAs substrate and, thereafter, cooling the wafer;

selectively etching and removing said first GaAs layer and said first n type AlGaInP layer;

forming a stripe-shaped insulating film pattern on a part of the p type GaAs cap layer;

removing portions of said p type GaAs cap layer and said p type AlGaInP cladding layer by etching using said insulating film pattern as a mask to form a stripe-shaped ridge;

using said insulating film pattern as a mask, selectively growing an n type GaAs current blocking layer on said p type AlGaInP cladding layer contacting opposite side walls of said ridge;

removing said insulating film pattern;

growing a p type GaAs contact layer on said p type GaAs cap layer and on said n type GaAs current blocking layer and, successively, growing a second n type AlGaInP layer and a second GaAs layer on said p type GaAs contact layer and, thereafter, cooling the wafer;

selectively etching and removing said second GaAs layer and said second n type AlGaInP layer;

forming a p side electrode on said p type GaAs contact layer and an n side electrode on the rear surface of said n type GaAs substrate.

18. The method of claim 17 including adding Zn as a p type impurity dopant while growing said p type AlGaInP layer.

19. The method of claim 17 including cooling said semiconductor substrate in one of a hydrogen atmosphere, a nitrogen atmosphere, and a mixture of hydrogen and nitrogen.

20. The method of claim 17 including selectively etching said first and second n type AlGaInP layers with hydrochloric acid and selectively etching said first and second GaAs layers with one of tartaric acid and sulfuric acid.

* * * * *